(12) United States Patent
Fitzgerald

(10) Patent No.: US 6,171,936 B1
(45) Date of Patent: Jan. 9, 2001

(54) METHOD OF PRODUCING CO-PLANAR SI AND GE COMPOSITE SUBSTRATE

(75) Inventor: Eugene A. Fitzgerald, Windham, NH (US)

(73) Assignee: Massachusetts Institute of Technology, Cambridge, MA (US)

(*) Notice: Under 35 U.S.C. 154(b), the term of this patent shall be extended for 0 days.

(21) Appl. No.: 09/224,720

(22) Filed: Jan. 4, 1999

Related U.S. Application Data

(62) Division of application No. 09/149,191, filed on Sep. 8, 1998.
(60) Provisional application No. 60/059,091, filed on Sep. 16, 1997.

(51) Int. Cl.[7] .................................................. H01L 21/20
(52) U.S. Cl. ............................................................... 438/503
(58) Field of Search ..................................... 438/129, 352, 438/357, 359, 360, 478, 481, 492, 503, 512, 692, 312, 509; 148/33, 33.2, 33.4, 33.5, 33.6

(56) References Cited

U.S. PATENT DOCUMENTS

| | | |
|---|---|---|
| 3,905,037 | 9/1975 | Bean et al. . |
| 5,243,200 | 9/1993 | Kawasaki et al. . |
| 5,256,550 | * 10/1993 | Laderman et al. ................... 438/509 |
| 5,602,057 | 2/1997 | Kawasaki et al. . |
| 5,648,280 | * 7/1997 | Kato .................................... 438/312 |

FOREIGN PATENT DOCUMENTS 0 514 018 A2    4/1992    (EP) .

OTHER PUBLICATIONS

Change, Y. et al., "Fabrication of Patterned $Ge_xSi_{1-x}$/Si Layers by Pulsed Laser Induced Exitaxy," Applied Physics Letters, No. 19, (May 1991): 2150–2152.

Shichijo, H. et al., "Monolithic Process For Co-Integration of GAAS and Silicon Circuits," International Electron Devices Metting, (Dec. 11, 1988): 778–781.

* cited by examiner

Primary Examiner—Charles Bowers
Assistant Examiner—Keith Christianson
(74) Attorney, Agent, or Firm—Samuels, Gauthier & Stevens, LLP

(57) ABSTRACT

A semiconductor structure including a silicon wafer having silicon regions, and at least one $Ge_xSi_{1-x}$ region integrated within the silicon regions. The silicon and $Ge_xSi_{1-x}$ regions can be substantially coplanar surfaces. The structure can include at least one electronic device configured in the silicon regions, and at least one electronic device of III–V materials configured in said at least one $Ge_xSi_{1-x}$ region. The structure can be, for example, an integrated III–V/Si semiconductor microchip. In accordance with another embodiment of the invention there is provided a method of fabricating a semiconductor structure, including providing a silicon wafer with a surface; forming a pattern of vias within the surface of the wafer; and depositing regions of $Ge_xSi_{1-x}$ within the vias. The method can include the step of processing the wafer so that the wafer and $Ge_xSi_{1-x}$ regions have substantially coplanar surfaces. Another embodiment provides a method of fabricating a semiconductor structure, including providing a silicon wafer with a surface; depositing regions of $Ge_xSi_{1-x}$ to the surface of the silicon wafer; and depositing silicon to the surface such that the deposited $Ge_xSi_{1-x}$ regions are integrated within silicon.

10 Claims, 2 Drawing Sheets

METHOD OF PRODUCING CO-PLANAR SI AND GE COMPOSITE SUBSTRATE

PRIORITY INFORMATION

This application claims priority from provisional application Ser. No. 60/059,091 filed Sep. 16, 1997, is divisional of 09/149/191 Sep. 8, 1998.

BACKGROUND OF THE INVENTION

The invention relates to the field of lattice-mismatched semiconductor material integration, and in particular to the integration of SiGe materials onto a Si substrate.

As many lattice-matched devices and circuits mature, interest in lattice-mismatched semiconductors, devices, and circuits has increased. There are two driving forces behind the increased commercial interest: integration and component performance. Integrating dissimilar semiconductor materials on a common substrate allows the designer to improve performance, lower cost, and increase reliability. Thus, the most susceptible applications to this initial advance will be systems that require multiple types of semiconductor materials currently packaged separately and combined in a more conventional packaging solution. Examples of these applications are III–V materials integration on Si, and SiGe circuit integration with Si CMOS. Such single-chip systems are anticipated to have wide application in communication technologies, particularly wireless communications technologies.

The utility of combined dissimilar semiconductors relies on the quality of the resulting material. Large lattice-mismatch between the substrate and deposited layer creates stress during material deposition, creating many defects in the deposited layer, resulting in poor material quality and limited performance. To control threading dislocation densities in high mismatched deposited layers, there are only two well-established techniques: substrate patterning and composition grading. In the case of substrate patterning, the idea utilizes the knowledge that the threading dislocations are a necessity of geometry, i.e. that a dislocation cannot end in a crystal. If the free edge is brought closer to another free edge by patterning the substrate into smaller growth areas, then it is possible to reduce threading dislocation densities. This technique works best for low mismatched systems in which dislocation nucleation is not rampant; however, it will reduce threading dislocation densities in high mismatched systems as well.

The other well-established technique is the use of composition graded layers. One can imagine that to reach a large total mismatch, a series of low mismatched interfaces could achieve great relaxation but keep threading dislocation densities low. This result is possible if each layer becomes substantially relaxed and is able to reuse the threading dislocations from the layer below. This method was long ago applied in an empirical way to GaAsP LEDs grown on lattice-mismatched GaAs substrates. However, after the GaAsP process was transferred to manufacturing, most of the subsequent lattice-mismatch research focused on single mismatched interfaces. The driving force for lattice-mismatched materials in applications decreased as AlGaAs/GaAs structures and InGaAsP/InP structures dominated optoelectronic and electronic device applications. Until these materials systems were fully exploited, the implementation of high mismatched layers seemed unnecessary.

A renewed interest in graded layers has occurred due to the increased demand for novel components, as well as an increased demand for increased integration. The advances in relaxed graded SiGe have shown that SiGe devices based on relaxed SiGe on Si, and the integration of III–V materials on Si using intermediate relaxed SiGe graded layers are possible. Thus, relaxed, graded SiGe layers can act as the material bridge between SiGe devices and/or III–V devices and Si substrates.

These materials advances, however, are incomplete unless a proper process sequence can be found to create these relaxed layers and subsequent devices with relatively standard Si circuit processing. A critical view of electronic and optoelectronic systems shows that the main data processing in many applications can be executed in Si CMOS circuits, which dominate the semiconductor industry today. To create a new realm of Si-based single-chip systems, a structure and process to combine Si CMOS circuits with the materials advances in relaxed graded SiGe mentioned above, is necessary.

SUMMARY OF THE INVENTION

The invention provides a method of producing a co-planar SiGe/Si substrate. The SiGe regions are formed using relaxed graded SiGe technology. The planarization process described below creates a modified Si wafer which can proceed through the Si CMOS process. At a convenient point in the CMOS process, the devices on or in the SiGe regions can be metallized and connected to the CMOS circuit, creating a single-chip system utilizing Si devices, SiGe devices, and/or III–V devices.

The invention also provides a semiconductor structure and method for producing such a structure in which relaxed GeSi crystalline alloy surfaces can co-exist in a planar fashion with Si. Such a substrate is essential in harnessing the plethora of applications in which the integration of GeSi materials and devices, and/or III–V materials and devices grown on GeSi, with Si electronics is desired.

Accordingly, in accordance with one embodiment of the invention there is provided a semiconductor structure comprising a silicon wafer having silicon regions, and at least one $Ge_xSi_{1-x}$ region integrated within the silicon regions. The silicon and $Ge_xSi_{1-x}$ regions can be substantially coplanar surfaces. The structure can include at least one electronic device configured in the silicon regions, and at least one electronic device of III–V materials configured in the at least one $Ge_xSi_{1-x}$ region. The structure can be, for example, an integrated III–V/Si semiconductor microchip.

In accordance with another embodiment of the invention there is provided a method of fabricating a semiconductor structure, comprising providing a silicon wafer with a surface; forming a pattern of vias within the surface of the wafer; and depositing regions of $Ge_xSi_{1-x}$ within the vias. The method can include the step of processing the wafer so that the wafer and $Ge_xSi_{1-x}$ regions have substantially coplanar surfaces. Another embodiment provides a method of fabricating a semiconductor structure, comprising providing a silicon wafer with a surface; depositing regions of $Ge_xSi_{1-x}$ to the surface of the silicon wafer; and depositing silicon to the surface such that the deposited $Ge_xSi_{1-x}$ regions are integrated within silicon.

These and other objects, features and advantages of the present invention will become apparent in light of the following detailed description of preferred embodiments thereof, as illustrated in the accompanying drawings.

DETAILED DESCRIPTION OF THE INVENTION

Figure 1A:
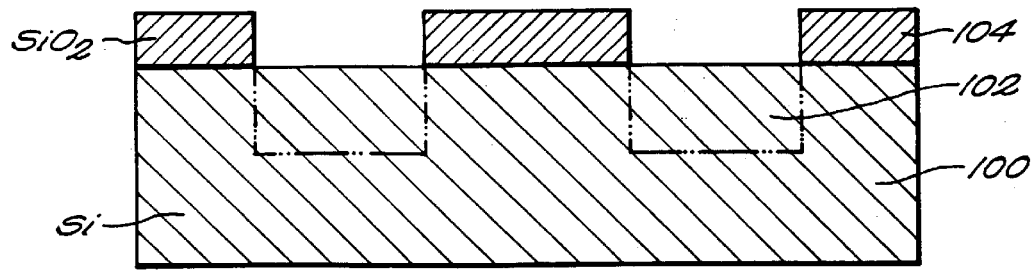
FIGS. 1A–1F are a series of side views of a semiconductor structure illustrating the process of producing a wafer of a substrate that possesses both GeSi alloys and Si at the surface in accordance with the invention.

FIGS. 1A–1F are a series of side views of a semiconductor structure illustrating the process of producing a wafer of a substrate that possesses both GeSi alloys and Si at the surface in accordance with the invention. FIG. 1A illustrates the first process step which involves initially patterning a conventional Si wafer 100. Such a wafer is usually a (001) orientated wafer, in which the off-cut of an (001) wafer is induced by polishing the wafer 6 degrees towards the [110] direction. The Si wafer should be patterned lithographically and masked such that vias 102 can be etched into the wafer. These vias will be the areas where the GeSi material will be deposited.

For example, the Si wafer can be coated with a layer 104 of $SiO_2$, covered with photoresist, and lithographically developed, producing the desired pattern in the wafer. HF-water or buffered etched solutions can be used then to remove the oxide from the areas in which the photoresist was removed. Finally, after the photoresist is removed, the Si vias 102 can be formed by immersing the wafer in an etch solution, such as KOH, which does not etch $SiO_2$. The result is the formation of the Si vias. If more vertical side-walls are desired, for example, a dry etch can be used instead of the KOH etch step.

Figure 1B:
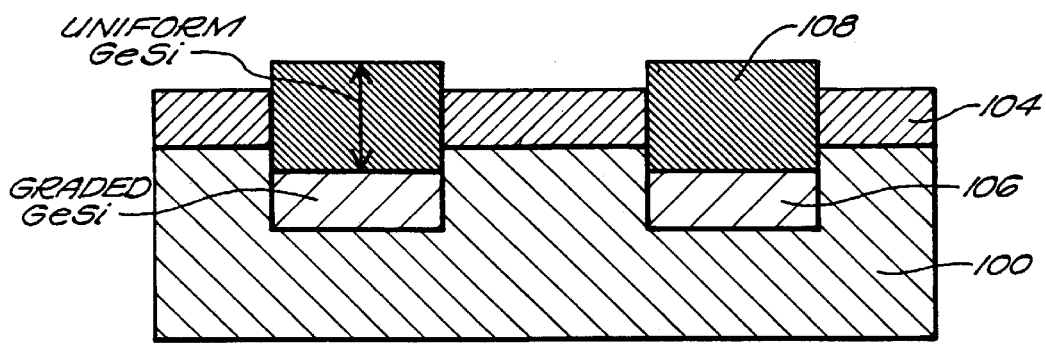

The wafer can then be cleaned to insure that no contamination is carried from the etch step into the rest of the process. The wafer is then inserted into a GeSi deposition system, such as a chemical vapor deposition system. As shown in FIG. 1B, a graded GeSi layer 106 is deposited such that the Ge composition is graded over the thickness of the material in the vias 102. At the end of the graded region, a uniform composition GeSi layer 108 of the desired composition is grown such that the growth surface traverses the Si surface before the end of growth. This requirement will ensure that the GeSi growth in the via extends above the surface of the Si wafer, and also ensures that the subsequent planarization step does not extend into the composition graded region, located below the uniform layer.

The conditions used for the growth of SiGe should be consistent with optimal growth conditions for relaxed, SiGe graded structures. For example, graded layers grown to alloy concentrations of 30% Ge are typically grown in UHVCVD at temperatures approximately 750–800C, and under reactor pressures of 25 mT. Grading rates are typically 10% Ge per $\mu$m or less.

Figure 1C:
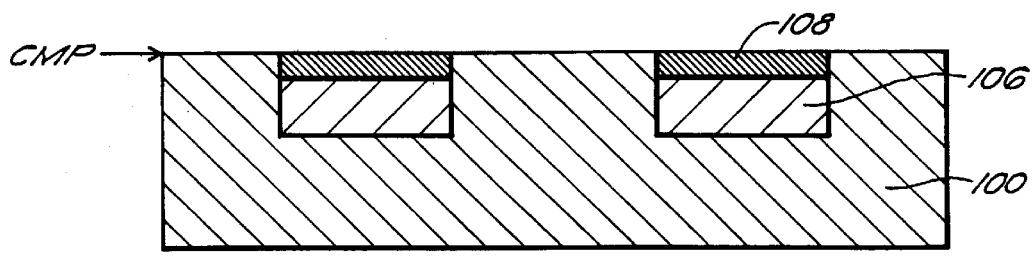

As shown in FIG. 1C, the wafer can then be chemomechanically polished back, so that the uniform GeSi regions 108 are co-planar with the Si surface. If the oxide layer is not removed for the polishing step, it can be used as a control in the polishing process. The change in colors as the wafer is polished will signal the approach of the Si wafer surface. When the Si surface is reached, the polishing can be ceased since the surface is co-planar.

It will be appreciated that with this substrate, it is now possible to insert the wafer into a conventional Si electronics (CMOS) production line and process the Si areas for Si electronics. The only restriction is that the Si CMOS process might be modified to reduce the temperatures of the highest temperature steps. This process may be required for the high-Ge alloys, such as 70–100% Ge in GeSi alloys. The melting point of these alloys approaches that of Ge, which is 936 C. Thus, if the GeSi alloy layer is graded to 100% Ge, the Si CMOS processing temperatures should be reduced so that the Ge layer is not damaged significantly.

It will also be appreciated that other advances in improved graded SiGe structures using planarization and/or CMP can be combined with this invention to improve the SiGe material quality. For example, the process described here can be used to create co-planar 50% Ge alloys with Si. Subsequent continued graded layer growth on the SiGe areas will result in improved SiGe alloys with high Ge concentrations on top of the SiGe via regions.

Examples of applications are the integration of GeSi transistors with traditional Si CMOS circuits and devices. In this case, the GeSi areas may be graded to 30% Ge, and the processing temperatures of the Si CMOS process would only have to be marginally modified.

Figure 1D:
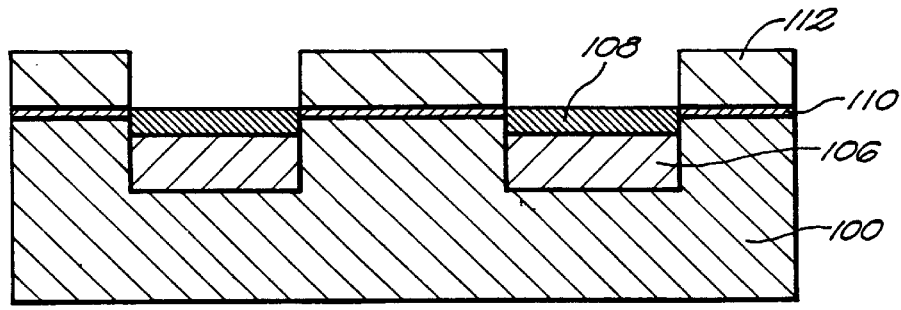

As shown in FIG. 1D, the Si CMOS electronics are shown as regions 110, and can include, for example, SI transistors and conventional interconnects therebetween. In the case of integrated III–V devices with Si CMOS, the alloys are generally graded to much higher lattice constants, e.g. 70–100% Ge. These higher Ge concentrations have larger lattice constants, and are therefore lattice-matched to some of the III–V materials. Also, in this case, it is imperative to use off-cut wafers at the initiation of the process, as described above.

Figure 1E:
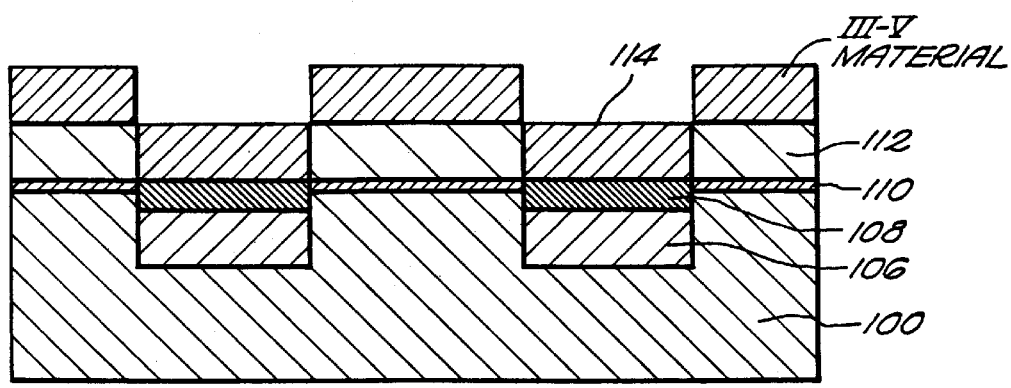
Figure 1F:
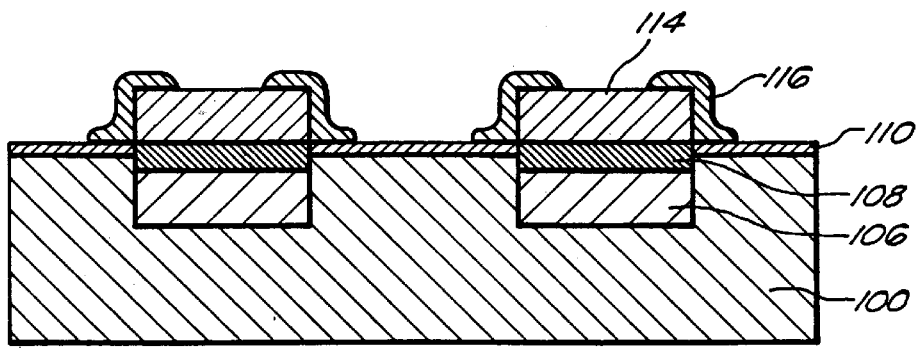

During CMOS fabrication on the Si areas, the GeSi areas can be covered with $SiO_2$ during the entire process. After the Si CMOS is fabricated, the areas above the GeSi can be exposed and the Si CMOS or electronics can be protected with a passivating mask layer 112 of oxide or nitride. Once the GeSi areas are exposed, layers 114 of III–V materials can be deposited, as shown in FIG. 1E. One must be careful in initiating the GaAs growth on Ge correctly in order to prevent high dislocation densities from forming in the GaAs layer. After III–V growth, the material can be defined or etched (the mask is dissolved and lifted-off), and metallization can occur in which the III–V devices are connected to each other and also the Si electronics via interconnects 116, shown in FIG. 1F, thus forming an integrated III–V/Si chip.

Figure 2:
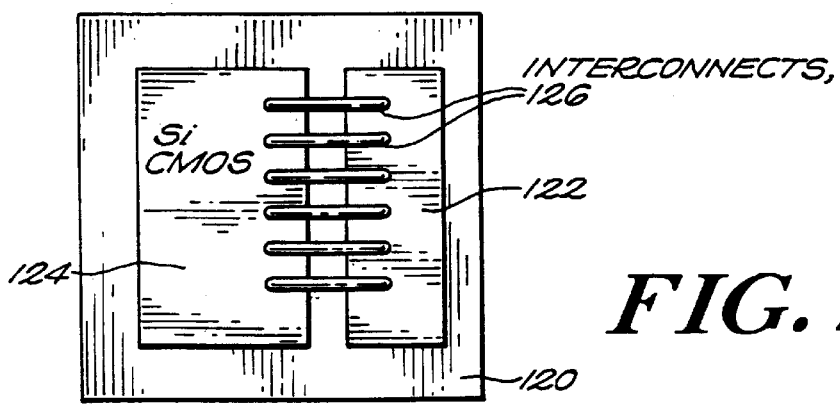
FIG. 2 is a top view of an exemplary co-planar Si electronics/GeSi composite substrate configured as a microchip.

FIG. 2 is a top view of an exemplary co-planar Si electronics/GeSi composite substrate configured as a microchip 120. The chip includes a GeSi region 122 fabricated as described heretofore, and a Si CMOS circuit region 124 connected to the GeSi region by interconnects 126.

Although the present invention has been shown and described with respect to several preferred embodiments thereof, various changes, omissions and additions to the form and detail thereof, may be made therein, without departing from the spirit and scope of the invention.

What is claimed is:

1. A method of fabricating a semiconductor structure, comprising:

providing a silicon wafer with a surface;

forming a pattern of vias within the surface of said wafer;

depositing regions of relaxed $Ge_xSi_{1-x}$ within said vias; and processing said wafer so that said wafer and relaxed $Ge_xSi_{1-x}$ regions have substantially coplanar surfaces.

2. A method of fabricating a semiconductor structure, comprising:

providing a silicon wafer with a surface;

depositing regions of relaxed $Ge_xSi_{1-x}$ to said surface of said silicon wafer;

depositing silicon to said surface such that said deposited relaxed $Ge_xSi_{1-x}$ regions are incorporated within said silicon; and planarizing said surface and said relaxed $Ge_xSi_{1-x}$ regions so that said surface and said relaxed $Ge_xSi_{1-x}$ regions have substantially coplanar surfaces.

3. A method of producing a wafer with substantially co-planar relaxed SiGe and Si areas at the surface, comprising etching vias in a crystalline Si substrate;

depositing a relaxed SiGe alloy in said vias; and planarizing said substrate and filled vias such that the relaxed SiGe and Si substrate surfaces are substantially co-planar.

4. The method of claim 3, wherein the relaxed SiGe alloy comprises a graded layer.

5. The method of claim 4, wherein the Ge concentration increases towards the surface.

6. The method of claim 3, wherein the relaxed SiGe alloy comprises a graded layer followed by a uniform composition layer.

7. The method of claim 6, wherein which the uniform layer transcends the Si substrate surface, such that after planarization, a portion of the remaining uniform layer is substantially co-planar with the Si surface.

8. The method of claim 3, wherein a SiGe heterostructure device is formed in the relaxed SiGe region.

9. The method of claim 3, wherein Si devices are fabricated in the Si regions of the substrate.

10. The method of claim 3, wherein the SiGe heterostructure devices are formed in the relaxed SiGe region and Si devices are formed in the Si regions of the substrate, said SiGe devices being integrated via interconnects, thus forming an integrated circuit.

* * * * *